US 6,567,715 B1

(12) United States Patent
Sinclair et al.

(10) Patent No.: US 6,567,715 B1
(45) Date of Patent: May 20, 2003

(54) METHOD AND SYSTEM FOR AUTOMATED ON-CHIP MATERIAL AND STRUCTURAL CERTIFICATION OF MEMS DEVICES

(75) Inventors: Michael B. Sinclair; Maarten P. DeBoer; Norman F. Smith, all of Albuquerque, NM (US); Brian D. Jensen, Ann Arbor, MI (US); Samuel L. Miller, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 0 days.

(21) Appl. No.: 09/553,989

(22) Filed: Apr. 19, 2000

(51) Int. Cl.[7] .................. G06F 19/00; H01L 29/40
(52) U.S. Cl. .................. 700/110; 700/121; 702/84; 257/48
(58) Field of Search .................. 700/108–110, 121; 702/33–38, 41–44, 81–84, 115–120; 73/763, 768, 862, 862.621–862.68; 257/415, 417, 48; 438/17, 18, 400

(56) References Cited

U.S. PATENT DOCUMENTS

| | | | | |
|---|---|---|---|---|
| 5,583,290 A | * | 12/1996 | Lewis | 73/514.18 |
| 5,683,591 A | * | 11/1997 | Offenberg | 216/2 |
| 5,786,621 A | * | 7/1998 | Saif et al. | 257/415 |
| 5,804,709 A | * | 9/1998 | Bourgoin et al. | 73/105 |
| 5,869,768 A | * | 2/1999 | Sato et al. | 73/783 |
| 6,006,593 A | * | 12/1999 | Yamanaka | 73/105 |
| 6,337,479 B1 | * | 1/2002 | Kley | 250/234 |
| 6,341,259 B1 | * | 1/2002 | Gutierrez et al. | 702/117 |
| 6,366,357 B1 | * | 4/2002 | Svetkoff et al. | 356/602 |

OTHER PUBLICATIONS

"Micro–Mechanical Test Sites on Wafers for Manufacturing," IBM Technical Disclosure Bulletin, Apr. 1990, USA, v.32, n. 11, pp. 375–376.*

* cited by examiner

Primary Examiner—Maria N. Von Buhr
(74) Attorney, Agent, or Firm—Brian W. Dodson

(57) ABSTRACT

A new approach toward MEMS quality control and materials characterization is provided by a combined test structure measurement and mechanical response modeling approach. Simple test structures are cofabricated with the MEMS devices being produced. These test structures are designed to isolate certain types of physical response, so that measurement of their behavior under applied stress can be easily interpreted as quality control and material properties information.

36 Claims, 10 Drawing Sheets

METHOD AND SYSTEM FOR AUTOMATED ON-CHIP MATERIAL AND STRUCTURAL CERTIFICATION OF MEMS DEVICES

GOVERNMENT RIGHTS

This invention was made with Government support under Contract DE-AC04-94AL85000 awarded by the U.S. Department of Energy. The Government has certain rights in the invention.

FIELD OF THE INVENTION

The present invention relates generally to post-process analysis and characterization of micromechanical devices and assemblies, and in particular to automated means for certification of MEMS fabrication processes at the substrate level.

BACKGROUND OF THE INVENTION

Microelectromechanical systems and their close relatives (which shall be known collectively as MEMS) are becoming attractive for a wide variety of applications, owing to their high functionality, small size, and potentially high reliability and low cost. However, despite the development of a large number of demonstration devices and a small number of commercial devices, design and processing of MEMS-based apparatus remains largely a trial and error process.

Variations in the material properties or gross structure of the MEMS devices can destroy the devices, or simply result in greatly reduced operational lifetimes. For example, two comb-driven micromotors which are apparently identical in structure and operational characteristics when new can show many orders of magnitude difference in the number of rotational cycles required to cause failure. Without sufficient control on the factors leading to such difficulties, widespread commercial application of MEMS technology is not to be expected.

A simplified example of a MEMS fabrication process would involve the deposition, patterning, and planarization of several material layers. The layers comprise such materials as polysilicon, silicon oxides, and silicon nitride. As these materials have different chemical properties, it is possible to use patterned composite structures to form the desired parts from (usually) polysilicon, and then to release the parts from the surrounding materials, primarily using chemical etching. Typical MEMS components have layer thickness of a few microns, and lateral dimensions from perhaps 10 to 1000 microns.

It is easy to list a variety of factors which can alter the functionality of a MEMS device after release. Perhaps the most obvious is the residual stress in the polysilicon components. This residual stress varies from point to point in the processed polysilicon, resulting in residual stress gradients which cause such components to warp in a manner determined by their geometrical structure and the magnitude and direction of the residual stress gradients. Sometimes warping can either be contained or compensated for by the design of the individual component. In other cases, for example meshing gears, where the thickness to diameter ratio can be as small as 1 to 1000, warping of any substantial magnitude cannot be allowed. Even when design can reduce problems associated with warping, a processing glitch which changes the residual stress from the design value can result in fabrication of components with reduced operational lifetimes. Similar problems can appear if the residual stress is not constant over the substrate, if the layer thicknesses vary from the design values, if the layer thicknesses are not consistent across the substrate, or if the surrounding materials are not entirely removed in the release process.

All of the above process errors interfere with the operation of the MEMS device through changing the expected degree of component warping, and do so while the component dimensions remain inside tolerances. Clearly, changes in component geometry will also cause warping to change. In principle such changes can also result from unexpected changes in the elastic properties of the polysilicon from which they are formed. Such changes can occur through a faulty polysilicon deposition (e.g. if voids or impurities are produced), if the surrounding materials are not completely removed in the release process, or (effectively) if geometric flaws in the components produce stress concentrations.

Although component warping is a serious problem, it is not the only route through which process variations can produce faulty MEMS devices. If a gear revolves around a simple hub, the rate of wear will depend on many factors, among which are the levels of friction and stiction between the surfaces, and the clearances, vertical and in shaft-aperture diameter difference, between the moving gear and the fixed hub. Process problems which can alter the expected levels of friction and stiction include producing rough or smooth interaction surfaces on release, not entirely removing the surrounding materials on release, growth of atypical material at the polysilicon/supporting material interfaces, and various types of unwanted surface contamination. The geometric clearances between the hub and the gear can be altered dramatically by small changes in layer thicknesses, by unexpected warping (e.g., the gear may warp so that it is forced up against the top of the hub), and by the presence of surrounding materials which are not entirely removed during the release process.

The above has only begun to touch on the enormous variety of MEMS processing problems that can lead to reduced lifetime of the resulting devices, or even to complete non-functionality. However, it is sufficient to suggest that a major barrier against routine commercial production of complex MEMS devices exists. This problem is made more difficult owing to the difficulty of detecting such process failures, especially in the absence of immediate structural failure when the device is released. An inappropriately warped part can be hidden in an internal portion of the device, where the degree of warping cannot be measured. If it is visible, the detection of an extra half-micron of component warp on a released component which is free to move and vibrate is not an easy challenge. Detection of residual material left after release is very difficult, as the changes in dimensions can be very small. Similarly, surface contamination is difficult to detect, particularly on a substrate with hundreds of highly complex multi-layer devices.

As the MEMS devices being fabricated cannot easily be measured or tested to reveal flaws resulting from processing defects, there is a need for standard test structures which will reveal clearly when such procession defects appear. In addition, in the design process there is a need for the precise measurement of mechanical properties, including the levels of friction and stiction expected in various regimes. This can also be addressed through the use of standard test structures.

Some work has appeared along these lines. However, the results of such measurements, even when carried out on a single substrate, are inconsistent. A group at MIT has examined the use of pull-in cantilever and fixed-fixed beam test structures to evaluate the quality of MEMS devices which are co-fabricated. They used the well-known transition which occurs as an attractive force is applied electrostatically between a supported member and a surface, between gradual bending of the member toward the surface, and abrupt collapse of the member onto the surface. The diagnostic quantity is the pull-in voltage (the voltage at which abrupt collapse occurs), the collapse being detected by the electrical contact made between the member and the surface.

A detailed mechanical model of the apparatus and the electrostatic forces associated not only with deflection of the cantilever, but of the highly nonlinear effects which enter in as the distance between the cantilever and the surface varies (that distance itself being a function of position along the cantilever) must then be used to extract, e.g., elastic properties from the pull-in voltage. However, the same process failures with which a commercial fabricator has to be concerned will act to change the interpretation of that measurement. Residual stress gradients and anchors which do not hold the beam parallel to the wafer surface will change the level of stress needed to get to the pull-in condition, and hence will alter the pull-in voltage with no other signature. Changes in component geometry or material from the expected can seriously alter the results of a pull-in measurement, again with telltale signatures. Finally, pull-in measurements give no information on friction or parallel stiction, although they can be used to infer some information concerning adhesion between surfaces.

To summarize, although the MIT techniques, when combined with state of the art geometric measuring devices, can provide useful information on certain elastic properties on a non-routine basis, it provides neither the breadth of information, nor the reliability of interpretation, which is needed for practical monitoring of commercial processes.

Other techniques have also been utilized to measure mechanical properties of MEMS structures, although they have not been applied to the problem of certification of large-scale commercial manufacture. In addition to the pull-in measurements described above, elastic properties have been measured by determining the resonance frequency of beams, and by measuring the force required to stretch a test member directly. Residual stress has been measured using arrays of buckled beams, passive deformable sensors (usually using capacitance as a probe), and by optically measuring the warping of a released MEMS element.

Unfortunately, the accuracy of these methods has been most unsatisfactory. Values for the Young'modulus vary from 90 to 190 GPa, with the value expected from bulk measurements being about 170 GPa. Similarly, the reported values for residual stress resulting from similar processing procedures vary widely, with the errors between competing techniques often being similar in magnitude to the actual levels of residual stress. In addition, these methods generally cannot resolve residual stresses below about 1 MPa, whereas good process control requires maintaining residual stresses below this value.

There is a need for an integrated and automated system, comprising accurate measuring techniques, equipment, and test structures, which can be used in a production process line to detect processing failures on a substrate-by-substrate basis. The instant invention is intended to address this need.

SUMMARY OF THE INVENTION

The invention is directed at providing reliable diagnostic information reflecting the quality of fabrication of MEMS devices. This is accomplished by cofabricating IMaP test structures, and then measuring their deformation behavior under particularly simple conditions of applied stress. The resulting data can be analyzed via detailed mechanical response models of the test structures to obtain useful information ranging from simple quality control feedback to accurate determination of material properties.

BRIEF DESCRIPTION OF THE DRAWINGS

FIG. 1 is a schematic illustration of a cantilever beam structure.

FIG. 3 shows a cantilever beam in various stages of deformation.

FIG. 4 shows multiply-anchored suspended beams. FIG. 4a is a generic version, while

FIG. 5 shows several alternate IMaP compliant members.

FIG. 6 shows several modes of stress loading which can be applied to IMaP test structures.

FIG. 8 shows IMaP dimensional standards.

DETAILED DESCRIPTION

Figure 1A:
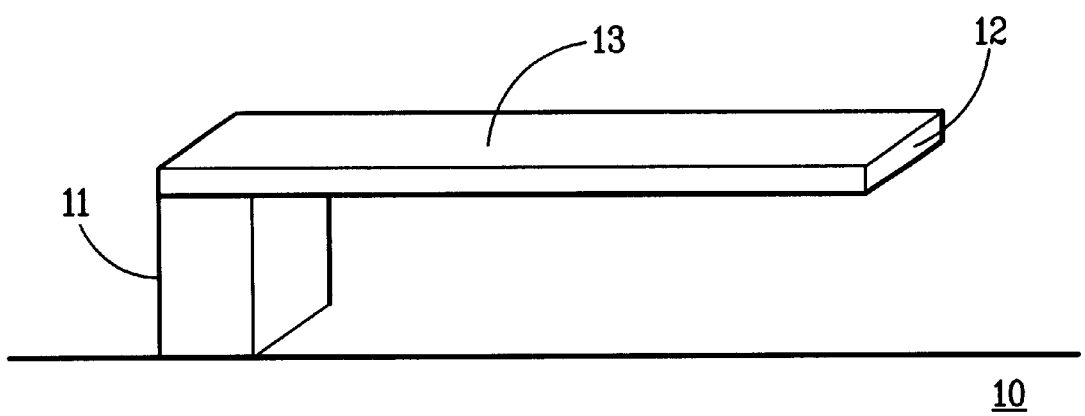
FIG. 1a shows an ideal unloaded beam.

Some thirty years of experience with microelectronics, especially integrated circuits, has shown the need for efficient and effective avenues for post-growth testing for the quality of the fabrication processes used to create the final devices. It has been found that the brute force approach of thorough functional testing of the circuits is not only time consuming, but does little toward prediction of premature failure or detection of uncommon error modes.

Among the quality control procedures developed in microelectronic fabrication is the co-fabrication of simple test devices and circuits on all production wafers. These test devices and circuits are thoroughly tested and characterized, and the results compared to those from equivalent test circuits fabricated under what is thought to be near-optimum conditions. If your integrated circuit has an insulating layer which holds off voltage pulses with a nominal voltage of 3 volts, it is very useful to know that, as actually grown, some process flaw caused the breakdown voltage of that layer to be 3.2 volts in the test devices, rather than the 6 volt design value. Although such circuits would probably function initially, they would likely experience premature failure. Further, such issues are wafer-scale, that is, probably affecting the entire wafer. As a result, finding a problem in characterizing the test circuits allows one to quickly identify entire wafers as suspect or simply as faulty. Such techniques have proven invaluable in the microelectronics industry. The present invention extends this approach to quality control testing to the realm of MEMS devices and apparatus.

As discussed earlier, past attempts at measuring mechanical properties associated with MEMS devices i.e., elastic properties, frictional forces, fracture thresholds, etc.) have proven to be both difficult to carry out, and quite inaccurate, with that inaccuracy not even being consistent within the use of a single technique. As a result, MEMS-based test structures have played little past role in quality control.

Applicants have succeeded in forming a system, called IMaP (Interferometry for Material Properties in MEMS), which provides reliable and rapid feedback concerning the effect of processing variables and conditions on the ultimate mechanical and structural behavior of MEMS devices. IMaP is a high-resolution interferometric imaging technique which measures complete deflection curves for electrostatically-actuated micromachined test structures. The deflection curves are routinely measured using one implementation of the instant apparatus to accuracies of about 2 nm.

Such deflection curves can be used in a variety of ways. By combining the detailed deflection curves with precise mechanical modeling of the test structures, it is possible to obtain material properties such as elastic constants, sliding friction and stiction coefficients, residual stress and residual stress gradients (induced during the growth and fabrication process), surface adhesion forces, and fracture limits.

Although this level of information is vital for the design of new devices, it is somewhat difficult to connect directly to the functionality of a specific device—particularly when a device flaw affects longevity, rather than initial function. If the issue is process control on an established process for an established device, it is possible to place limits on the deflection curves themselves which are obeyed in a high-quality process, but are violated when quality degrades to a level that interferes with the desired level of functionality. Such simple criteria encourage the use of such feedback routinely in production facilities.

The complete working out of material properties for a MEMS fabrication process, and the quick and dirty use of measured deflection curves for instant quality control feedback are perhaps two ends of a spectrum of potential uses for the instant invention. In all cases, however, various sources of error had to be identified, and either eliminated or compensated for.

The primary experimental technique is the measurement of the deformation of surfaces when loaded with (usually) well-characterized forces. When the forces are not well-characterized, errors appear which are difficult to compensate for without additional knowledge. An example is the effect of residual stress in measurements of elastic properties. One approach toward measuring elastic properties is to form a cantilever beam over a surface, and then to measure deflection while a voltage is applied between the surface and the beam. This produces an electrostatic force which serves to pull the beam toward the surface. The shape of the deflection curve is then determined by the force, the geometry of the beam, and the material properties of the beam. If two sets of information are known, then the third can be obtained. Usually it is assumed that the geometry of the beam and the force applied are known, and the elastic properties of the beam are obtained by continuum mechanical modeling.

However, there are several sources of potentially serious errors in this apparently simple experiment, leading to published "experimental" values for the Young'modulus of polysilicon ranging from 90 to 190 GPa—the actual value is about 160 GPa. One source of error is mechanical stress left in the beam by the fabrication process. Such residual stresses are commonplace, and often cause a cantilever beam to curl up or down. The error results partially from the fact that the residual stress has to be added to bending stresses generated by the applied electrostatic force. This skews the measurement of elastic properties by an amount which depends on the ratio between the residual stress and the stress induced in the beam by the electrostatic activation. This ratio is often large enough to signal the presence of very large errors.

Another common source of error is that, unlike the assumption made in analytic beam flexure calculations, the supports of the beam are compliant, and themselves deform when the beam is loaded. This action relieves some of the force otherwise acting to bend the beam, thereby introducing an error into the evaluation of elastic properties.

An additional source of error is that, as implemented using common MEMS fabrication processes, the supports of the beam do not produce in the unstressed state a beam which initially runs parallel to the substrate surface. Instead, a small angular offset appears to be induced by the supports. The magnitude of these nonidealities can be determined from the results of a suite of other IMaP measurements. If ignored, however, the associated artifacts can dramatically alter the values determined for, e.g., the elastic constants. In the IMaP technique as claimed here, all these quantities are obtained from data from a single testing apparatus and method.

There are three major areas on which the instant invention depends—the proper design of IMaP test structures, precise measurement of test structure deflection, and a highly-sophisticated IMaP test structure modeling capability. These aspects, and their interconnection and interrelation in the instant invention, are discussed below.

A variety of MEMS structured devices have proven of value for IMaP applications. These include devices designed to measure bending and torsion in beams, frictional and stictional forces between sliding surfaces, surface adhesion forces, and various fracture modes near stress concentrators. These devices are based on a common set of submechanisms which are easy to fabricate, measure, and interpret for MEMS quality control purposes.

Figure 1B:
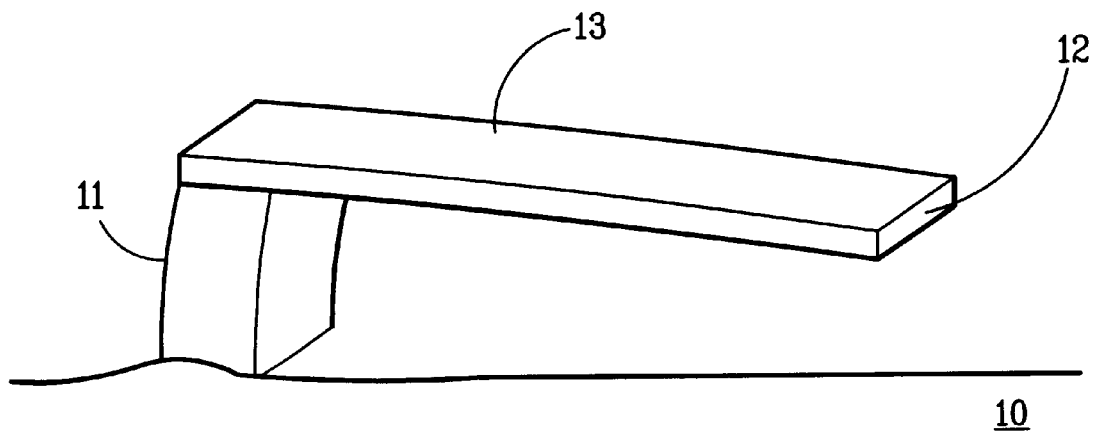
FIG. 1b shows a beam whose free end is being subjected to a downward force. Note that both the anchor and the substrate also deform in response to this force.

One set of submechanisms are compliant stress members. These are mechanisms which respond to applied stresses in a manner which is directly related to their geometry and their material properties. A first example appears in FIG. 1, which shows an ideal model of a cantilever beam structure formed on a substrate. A cantilever beam 12 with an exposed surface 13 is attached to a substrate 10 by anchor 11. Typical cantilever beams have a nominally rectangular cross-section, although this is not necessary for the present application. Similarly, typical cantilever beams for IMaP applications will have essentially constant cross-section on their length away from anchor 11. They thus take the form of a rectangular box, which adds considerably to the simplicity of data interpretation. In practice, the deformation of beam 12 is usually measured by interferometric imaging of exposed surface 13, but a variety of other measurement techniques (profilometry, conformal imaging, evanescent wave optical scanning microscopy, scanning tunneling microscopy, capacitive scanning microscopy, etc.) can be used. The result is what can be called a bending-moment tester, in that a simple bending deformation is generated by a known stress.

Data taken by measuring deformation of cantilever beams cannot properly interpreted unless several sources of potential error in the setup or modeling of the mechanical response problem are included. An important source of modeling error is to ignore the elastic response of anchor 11 and of the substrate 10 to the force applied to and transmitted by beam 12. This response is a deformation, shown in exaggerated form in FIG. 1*b*, which serves to reduce the stress energy in the bent beam 12. Ignoring the compliance of these structures can induce twofold errors in measurement of elastic constants.

Figure 2A:
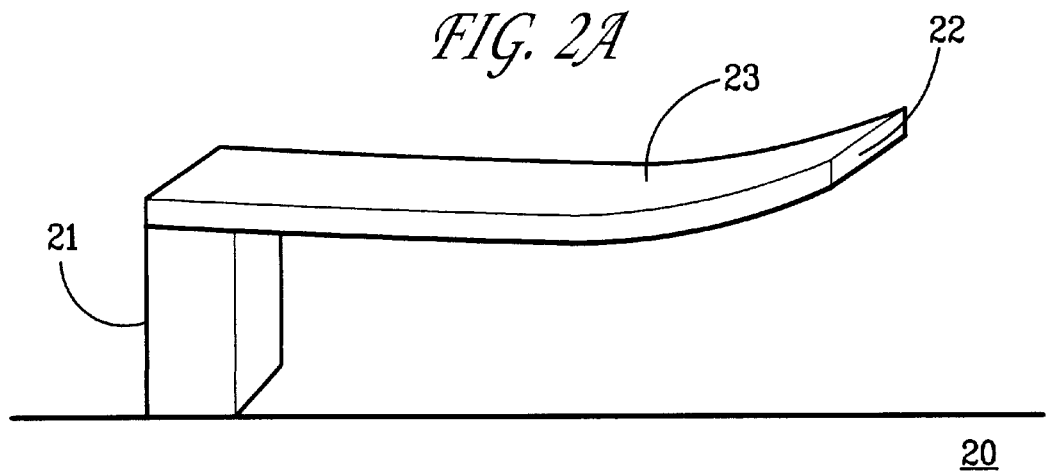
FIG. 2a shows initial beam deflection driven by a residual stress gradient.

Several process-related sources of error are shown in FIG. 2. Here appear several nonideal cantilever beam structures similar in basic structure to those shown in FIG. 1. FIG. 2*a* shows the effect of a gradient in residual stress in the material of beam 22. This initial curvature alters both the level and distribution of electrostatic force generated by a potential difference and the amount of beam bending for a given level of applied stress. The initial shape must be measured and included in models if actual values for, e.g., elastic properties are to be extracted from beam bending measurements.

Figure 2B:
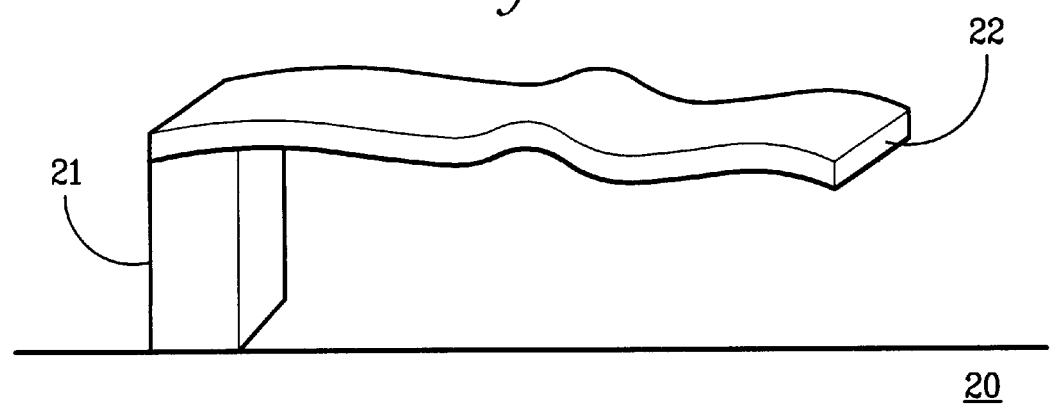
FIG. 2b shows irregular initial beam deflection driven by inhomogeneous residual stress distribution in the beam. 2c shows a beam with an initial offset angle, usually driven by inhomogeneous residual stresses in the anchor.
Figure 2C:
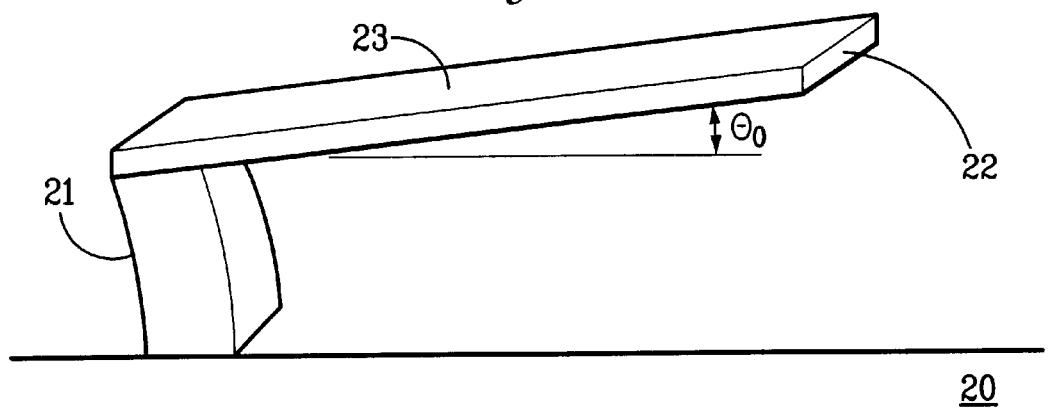
FIG. 2 shows several sources of error in analysis of the deformation of a cantilever beam structure.

Similarly, FIG. 2*b* shows a situation where the residual stress gradient through the thickness of the beam is both. non-zero and inhomogeneous on the length scale of the beam. Again, the initial displacement has to be understood, as well as the effect of the warping of exposed surface 23 on the deformation measurement technique being used. A related effect is shown in FIG. 2*c*. Anchor 21 can have an inhomogeneous residual stress, which induces an initial offset angle $\theta_o$ to beam 22.

The beam is made to deform in response to an applied stress (or a residual material stress), and the deflection of the beam is then measured. There are many ways of applying a bending moment to the beam, but probably the easiest and most directly applicable to MEMS-based structures is to impose a difference in electrical potential between the beam and the substrate. This produces an electrostatic force which is proportional to the magnitude of the voltage difference, but can depend on the amount of beam deflection in a complex manner. Various modes of loading will be discussed later.

Figure 3A:
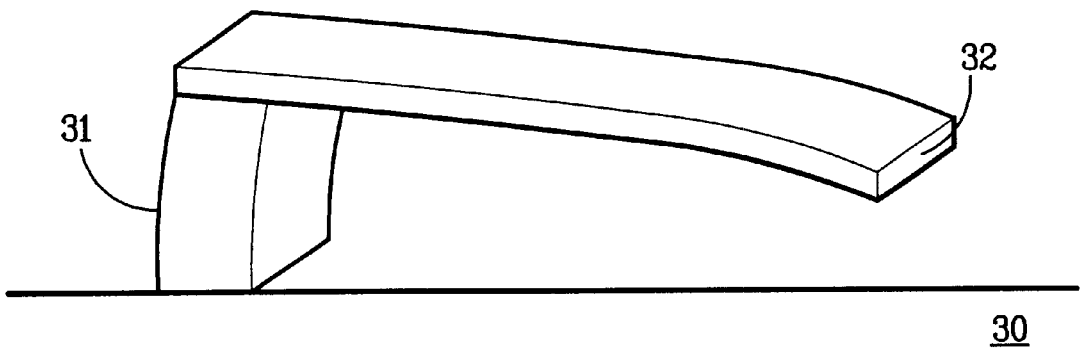
FIG. 3a shows a beam which is bent, but not enough to make contact with the substrate.

Applying a voltage difference will cause beam 32 to approach substrate 30. However, because of the mechanical attachment to anchor 31, the beam does not bend uniformly, but rather takes on a curved form (FIG. 3*a*). As shown schematically here, anchor 31 also responds to the applied force by bending, thereby reducing the stress energy of beam 32 somewhat. When the free end of beam 32 is bent roughly ⅓ of the distance down to substrate 30, an adhesive catastrophe takes place, and the end of the beam snaps down to the substrate and is adheres to the surface. The surface adhesive forces between these two nearly atomically flat surfaces provide and additional force which leads to the situation in FIG. 3*b*, where a substantial length 34 of beam 32 has collapsed onto substrate 30.

Figure 3B:
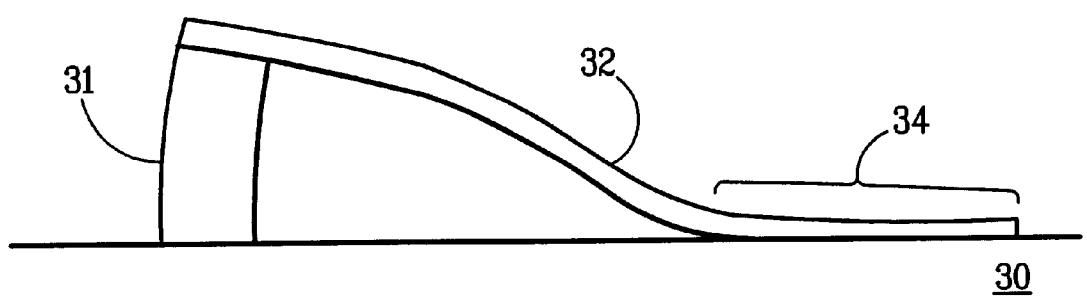
FIG. 3b shows a beam which has adhered to the substrate.

The basic approach toward analysis of the cantilever beam deformation changes from that of a bent beam in the situation shown in FIG. 3*a*, to that of fracture mechanics, with the additional notions of crack length s and surface and interfacial energies for the adhered beam of FIG. 3*b*. The shape of the bent beam is determined primarily by the elastic properties and geometry of beam 30 and of anchor 31 (with some contribution also due to elasticity of the substrate), and the details of how the force is applied to the beam. The primary information obtained in this regime speaks to shape and dimensional quality control. (In principle the deposition could be so defective that the effective elastic properties change, but this is an unlikely situation which carries along other diagnostic information, such as visible changes in growth quality.)

In contrast, the cantilever beam deformation for the adhered beam of FIG. 3*b* is also influenced by the difference between the free surface energies of the beam and substrate surfaces and the interfacial energy when these surfaces are in contact. If the beam and substrate were clean and flat, these quantities would be dominated by the surface energies, the contact area would be the geometric area, and interpretation of the experimental results would be straightforward.

The actual situation, however, is not so pleasant. The surfaces coming into contact are rough, and usually have a thin contaminated layer. In addition, there can be residual fluids remaining from the release step or other processing steps. The actual surface and interface energies will depend strongly on the nature of the contaminated layer. These energies multiplied by the ratio of actual contact area to geometric contact area (e.g., assuming the surfaces are flat), give what can be called effective surface and interface energies for adhesion. If the surfaces are contaminated on the monolayer scale, but no other effects are relative, the actual contact area to geometric contact area is essentially determined by the roughness of the surfaces, their elastic properties, and the contact pressure.

This situation is not characteristic of actual devices, however. The usual release processes appear to leave a small amount of liquid behind in the surface pores and crenellations of the released surfaces. When the surfaces become adhered, capillary forces can act on this fluid to fill in some of the interfacial cracks, thereby dramatically increasing the actual contact area between the surfaces. As a result, the adhesion energy is generally expected to be a function of contact time, and that dependence will be strongly influenced by processing conditions and flaws.

An additional difficulty is generated by the possible presence of occasional surface structures which are much larger than the surface roughness length scale. Examples would include dust between the surfaces, and sacrificial material which is not totally removed in a defective release step. Such structures, even if they are isolated on the surface, can dramatically reduce the actual contact area, thereby reducing the adhesion between surfaces.

It is clear that measurement of beam deflection and of the adhesion between the surfaces of a beam and a substrate gives a great deal of information concerning how the fabrication process has actually been carried out. Dimensional artifacts, surface roughness, surface contamination, residual process fluids, and dust contamination all will produce anomalous test structure behavior. Such measurements are therefore one of the bases for the instant invention.

Figure 4A:
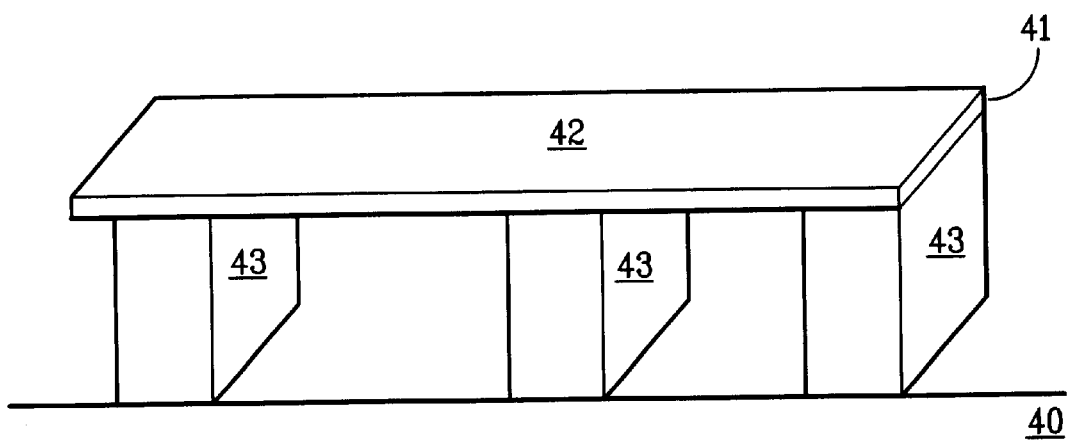

A second common type of compliant member is a multiply-anchored suspended beam as shown in FIG. 4.

Figure 4B:
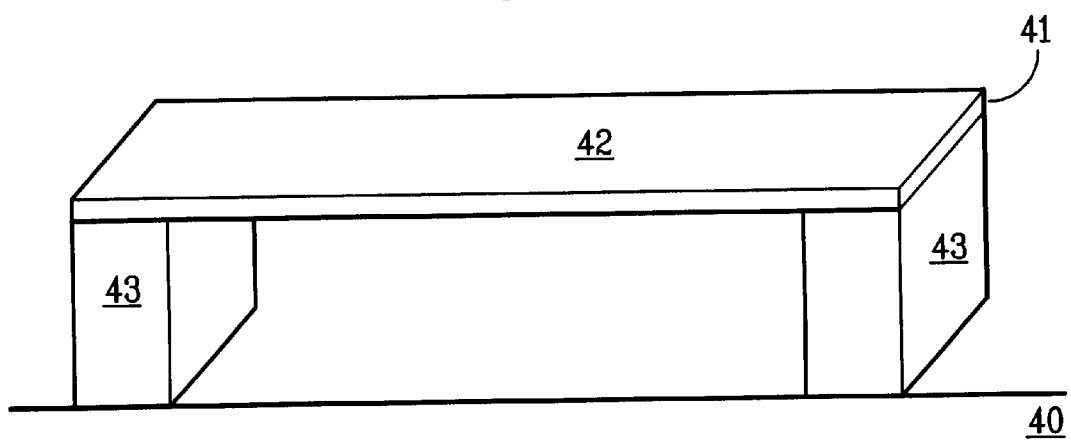
FIG. 4b is a fixed-fixed beam configuration.

Here a beam 41, which has an exposed surface 42, is suspended over a substrate 40 by multiple anchors 43. In operation, the beam is loaded by a force, often electrostatically generated, which acts to deform beam 41 between the multiple anchors 43. In practice, the most common such structure is the fixed-fixed beam, which is shown in FIG. 4b. Such structures tend to be more robust than are the cantilever beams.

Multiply-anchored suspended beams exhibit deformations which are subject to most of the same interpretive problems as appear for the cantilever beams. Residual stresses and residual stress gradients still affect the initial state of the beam, although the displacements caused thereby are often smaller than for cantilever beams. Stress inhomogeneities still can cause the beam to take on an initial offset angle at each anchor 43, that offset angle being different for each anchor. Stress will still be transmitted through beam 41 to distort the anchors and the underlying substrate. The effects which influence an adhesion measurement also remain present, although the effect of slip along the surface is lessened. As in the case of cantilever beams, therefore, it is necessary to take a wide range of geometric and material effects into account to extract fundamental material properties from deformation measurements on multiply-anchored suspended beams.

Figure 5A:
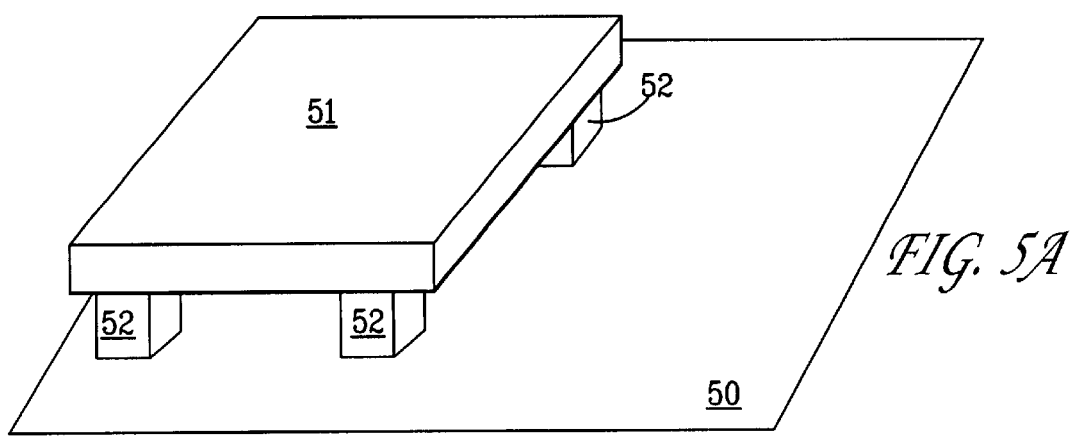
FIG. 5a is a multiply-attached plate.

Other compliant members which can be used in IMaP test structures are shown in FIG. 5. FIG. 5a shows a multiply-anchored plate, comprising a plate 51 suspended over a substrate 50 by multiple anchors 52. Such structures can always be used for elastic property and adhesion measurements, but are particularly useful when the materials from which the structures are grown show significant anisotropy, as elastic constants along multiple axes can simultaneously be measured. The plate 51 need not be rectangular or, indeed, any simple shape in cross-section parallel to the substrate surface. Multi-axis results can be obtained, for example, if a Y-shaped plate is used.

Figure 5B:
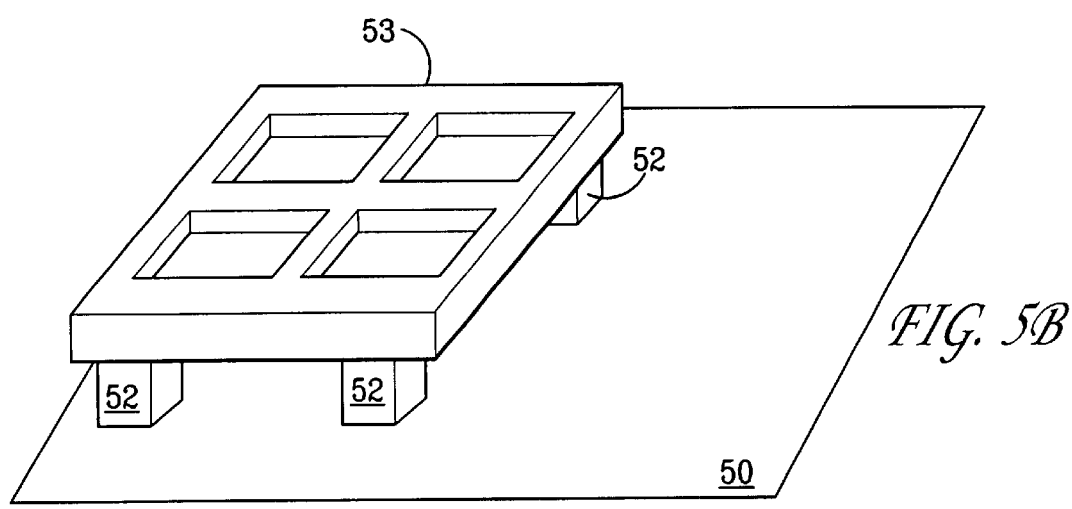
FIG. 5b is a multiply-attached plate where the plate is multiply connected.

FIG. 5b shows a multiply-anchored plate similar to that of FIG. 5a, but where the plate 53 has a complex multiply-connected structure. Such structures can be designed to allow measurement of multiple elastic constants using only the single structure.

Figure 5C:
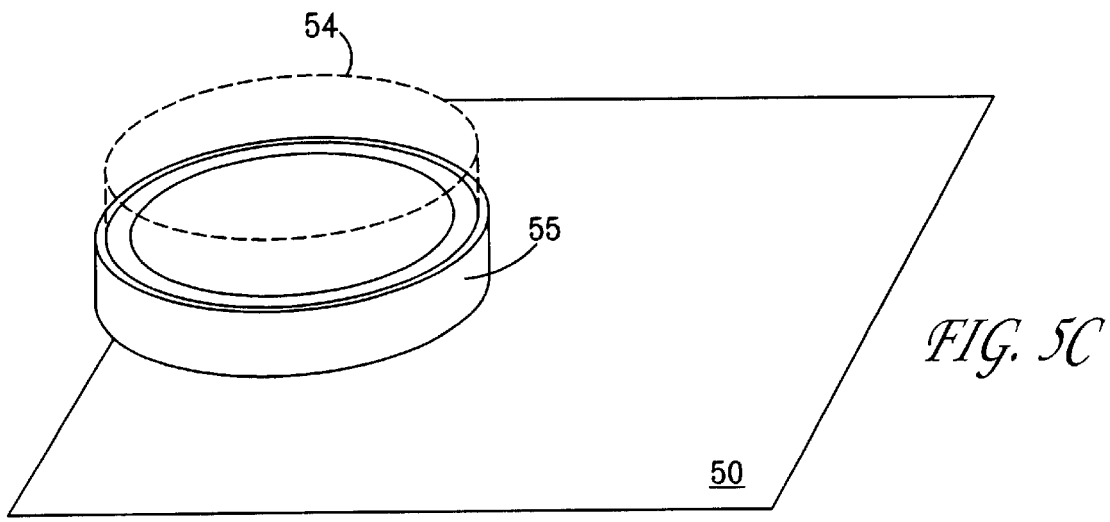
FIG. 5c shows an edge-supported diaphragm.

Finally, FIG. 5c shows an edge-supported diaphragm, which can also be used as an IMaP compliant member. Diaphragm 54 is suspended above substrate 50 by edge anchor 55, which extends entirely around the diaphragm. Again, similar artifacts and errors must be taken into account to properly interpret measured diaphragm displacement.

A second set of submechanisms concerns how a controllable deformation force is applied to the compliant member. In the instant invention the force is applied electrostatically, resulting both in control and flexibility in loading conditions. It is possible to arrange out of plane deformation forces (out of plane deformations are easiest to measure with the accuracy and resolution required) to be generated by, e.g., comb electrostatic actuators, but in general it is easier to use direct electrostatic interaction between the compliant member and the substrate to provide this force.

Figure 6A:
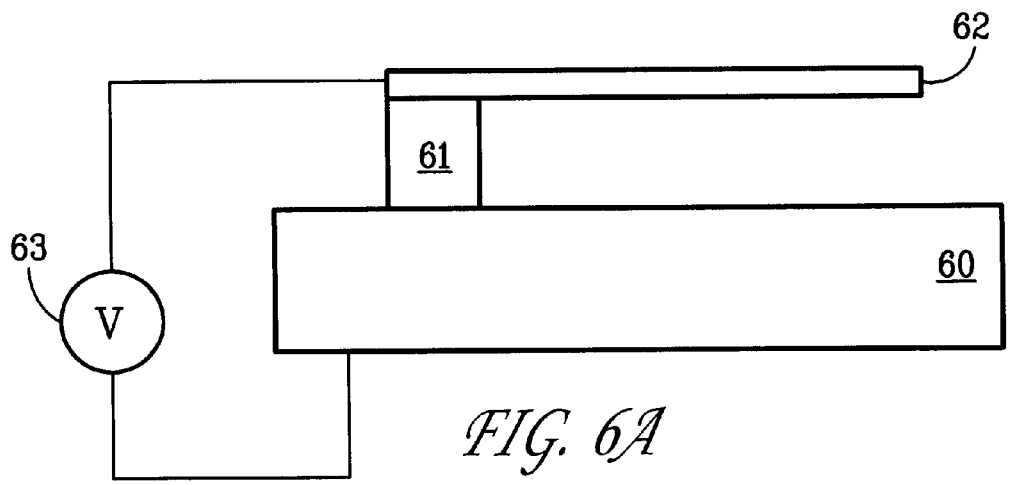
FIG. 6a shows distributed loading.

For purposes of reference the general type of electrostatic actuators which are shown in FIG. 6 will be called capacitive actuators, and function by direct electrostatic interaction between a compliant member and a substrate. FIG. 6a shows the simplest such actuator, here implemented on a cantilever beam 62 anchored on a substrate 60 by anchor 61. As shown, substrate 60 and beam 62 are both electrical conductors, and are insulated from each other. Voltage source 63 produces a voltage between substrate 60 and beam 62, and thus an attractive electrostatic force is generated between the substrate and beam. As this force is applied to the entire length of the beam, this will be called a distributed loading mode. To first order the beam moves toward the substrate as driven by the force, but it is important, as discussed earlier, to include the elastic deformation of anchor 61 and substrate 60.

If the beam is initially flat and parallel to the surface (questionable assumptions, as discussed earlier), the initial stress induced by the applied voltage is rather simple, producing a constant downward pressure over the length of the beam. The force distribution, however, becomes much more complex as the beam deforms. The interaction force between the charges on the beam and the charges on the substrate varies with distance. The bending of the beam not only changes the interaction distance, but also can change the distribution of charges on the beam and on the substrate. As a result, the force actually applied to the beam as a function of applied voltage can be a complex function depending on many factors, geometric and material. Measuring the beam deflection as a function of applied voltage is therefore again confirmed as providing useful process quality control information.

Figure 6B:
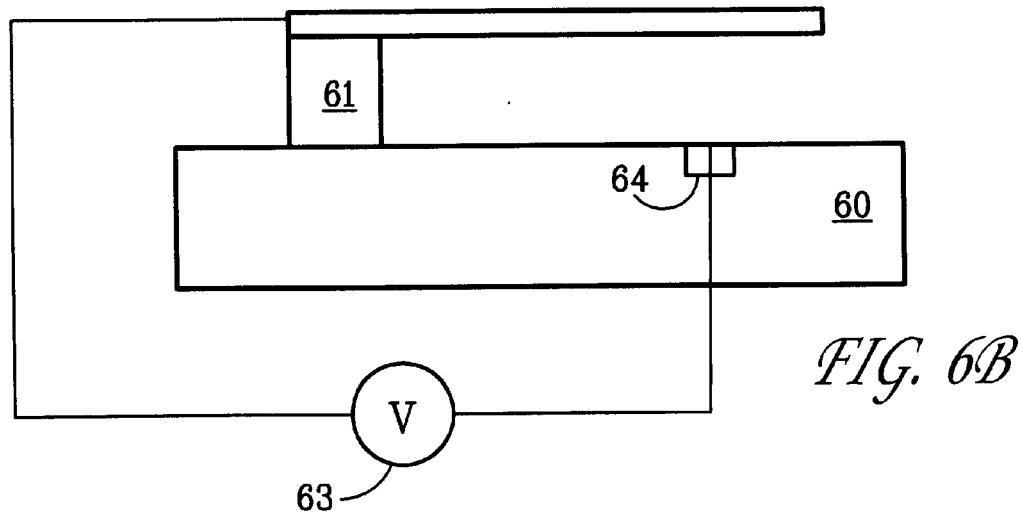
FIG. 6b shows point loading.

A simpler loading geometry, perhaps more suitable when the goal is to measure the actual values of material properties, is that of point-loading. A version of point-loading is shown in FIG. 6b, where cantilever beam 62 is anchored above substrate 60 by anchor 61. In this case, a conductor 64 which is insulated from the substrate (or which lies in an insulating substrate) crosses under beam 62. Voltage source 63 is now attached to beam 62 and to conductor 64. Because of the inverse-square electrostatic force law, the force resulting from electrostatic interaction between the beam and the conductor is concentrated in the immediate neighborhood of a single point on the beam. The result is a relatively simple dependence of applied force on voltage and the extent of bending. This allows simpler models to be used in analysis of the beam deformation.

Figure 6C:
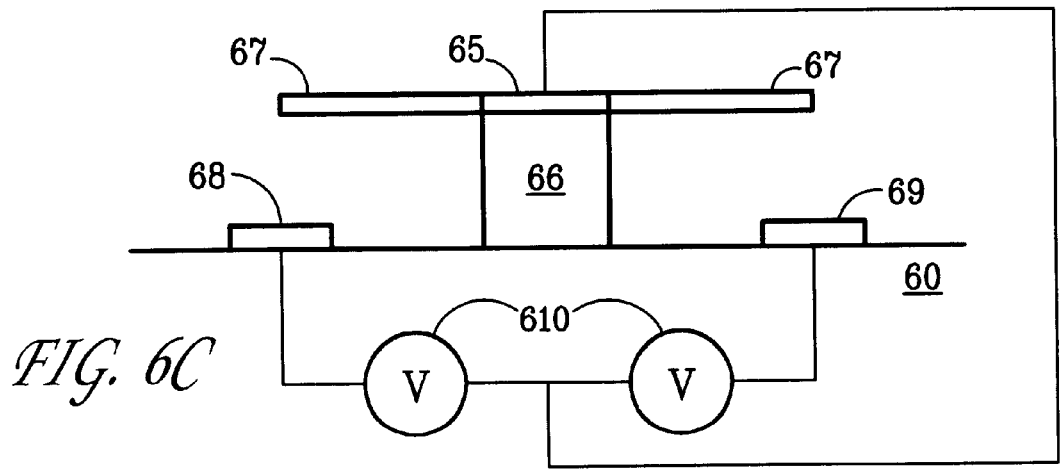
FIG. 6c shows torsional loading.

A final example, which can be also be used in IMaP test structures, is that of torsional driving. FIG. 6c shows an end view of a torsionally driven fixed-fixed beam structure, in this case implemented as a torsion-moment tester. Beam 65 is suspended at both ends above substrate 60 by anchors 66. At some point between the anchors, beam 65 widens to form paddle-like torsional drive plate 67. A pair of capacitor elements 68 and 69 are positioned on the substrate surface under the ends of torsional drive plate 67, and are insulated from both the substrate and from beam 65. A dual voltage source 610 is attached to the torsional drive, so that beam 65 is grounded, element 68 has a voltage of a first polarity applied, and element 69 has a voltage of a second polarity applied. In general, when voltages are applied the electrostatic interactions will apply a mechanical torque about the long axis of beam 65. This torque can be pure, but more often is combined with a net vertical component of force. If the voltages are adjusted properly, the electrostatic forces can result in a pure vertical force being imparted to beam 65.

Torsional loading capacitive actuators are therefore more versatile in applying force than are the distributed or point loading structures. A single test structure can investigate both uniaxial and torsional loading, thereby providing more data on elastic behavior than do the linear beams. However, the beam deformation is complicated by the stress concentrations and nonuniform stiffness induced by the presence of the torsional drive plate 67. Use of such structures in IMaP testing thus required evaluation of cost-benefit levels for the differing techniques.

Other approaches toward capacitive electrostatic actuators are possible, but are usually minor modifications of the examples shown in FIG. 6, or are combinations of those examples, and are intended to be included in the scope of this invention.

Many practical IMaP test structures consist essentially of a combination of these first two submechanisms, and are capable of measuring beam bending, beam torsion, combined beam deflections and surface adhesion. Any IMaP test structure of this general type, if the capacitive electrostatic actuators is left out, or remains nonfunctional, can be used as a passive IMaP test structure. These are primarily useful for evaluation of residual stress and initial offset angles.

Another class of passive IMaP test structure which can be useful to include are IMaP metrology standards. These are structures whose only purpose is to fabricate structures which are intended to be of a certain size if the fabrication process functions properly. The actual dimensions can be measured using a variety of techniques, including length measurements by profilometer, microscopic image analysis, or electron microscopy, and depth measurements using interferometry, capacitive probes, and profilometry.

Figure 7:
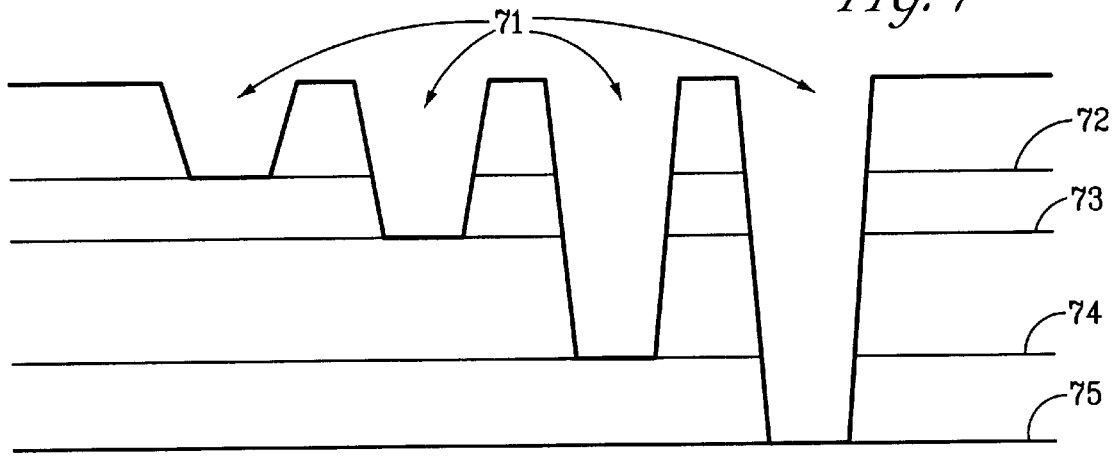
FIG. 7 shows an IMaP dimensional standard for direct measurement of layer thickness.

There are three major types of IMaP metrology standards, depth standards, length standards, and orientation standards. Most MEMS structures are fabricated using a multilayer process where individual layers are made up of parts and sacrificial material. The function and reliability of the final MEMS device often depends on the layers having the right absolute or relative thicknesses. In addition, having an independent measure of layer thickness makes the modeling and analysis of elastic parameter data from IMaP test structures easier to accomplish. The IMaP metrology standard for layer thickness, as shown in FIG. 7, can be as simple as a series of pits 71 etched in a substrate 70 down to the appropriate layer interfaces 72–75. The pit depth is then measured by any one of a number of conventional methods, some of which were listed above.

Figure 8A:
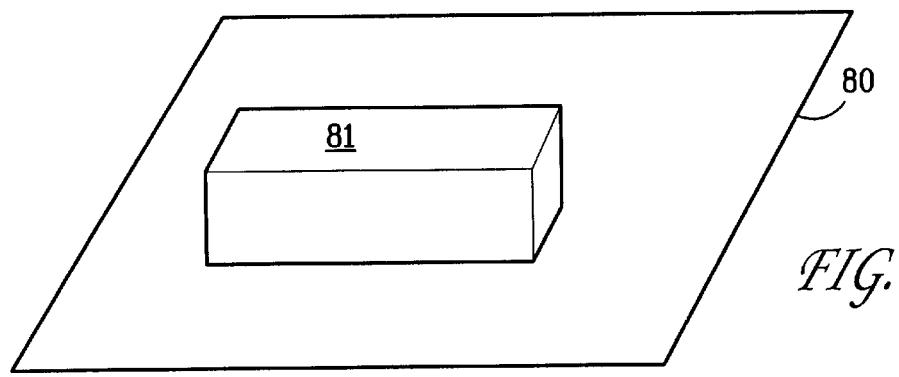
FIG. 8a shows a typical linear dimensional standard.
Figure 8B:
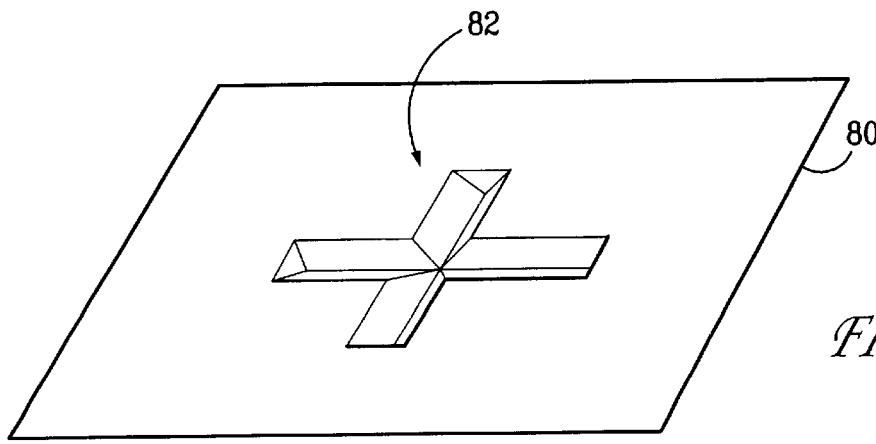
FIG. 8b shows a typical orientation standard.

IMaP length standards can "piggyback" on the structure of other IMaP test structures, or can stand alone. All that is needed to provide this function is a fabricated feature 81 on a substrate 80, having what should be a known length, as shown in FIG. 8a. Similarly, FIG. 8b shows an IMaP orientation standard can be provided by fabricating a structure 82 on a substrate 80 which clearly identifies at least two orientations which are intended to be separated by a known angle. If post-fabrication measurement reveals a different angle, then some systematic error was inadvertently introduced into the pattern definition steps of the fabrication process. Dimensional information is easy to establish, but is so important for MEMS applications that these independent tests for correct dimensions can be worthwhile.

There are two special IMaP test structures which have special utility. The first is a class of test structures which measure the frictional and stictional forces involved when two processed surfaces slide along each other. Previous groups have studied such effects using a comb actuator driven friction pad, but the levels of sliding stress which can be thus achieved are too small to measure friction and stiction under MEMS operational conditions. The instant sliding friction tester generates large forces over small displacements by bending a beam.

Figure 9:
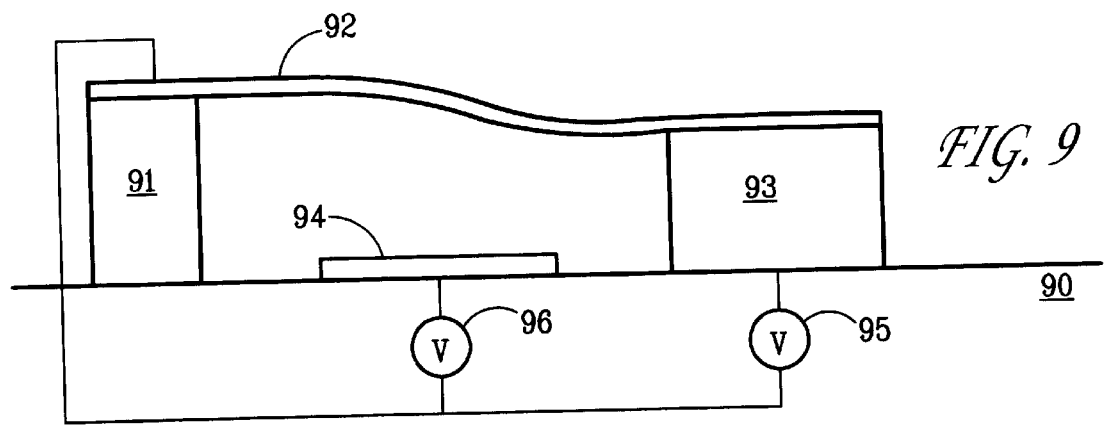
FIG. 9 shows a basic design for a sliding friction/stiction tester.

FIG. 9 shows a simple type of such a test structure. Beam 92 is supported above substrate 90 by anchor 91. Friction pad 93 is free to slide along substrate 90 when contact is made between the neighboring surfaces. Friction pad 93 and beam 92 are electrically insulated from substrate 90. An electrostatic load is applied to press the friction pad against the substrate surface by connecting a voltage source 95 between substrate 90 and beam 92. Similarly, an oscillating force is applied to beam 92 by connecting an oscillating voltage 96 between beam 92 and substrate electrode 94.

In use, the friction pad is pressed against the surface of the substrate by a force generated by a first voltage applied between the beam and the substrate. Then a second oscillating voltage applied to electrode 94 causes an oscillating vertical force on the beam 92. This force causes the beam to deflect upward and downward about an equilibrium position. In doing so, the effective length of the beam changes, so that a force appears which attempts to slide the friction pad back and forth along the substrate. If this force is too small, the beam follows fixed-fixed deformation mechanics, as revealed by measurement of the shape of the top surface of the beam.

When the force becomes large enough to overcome stiction between the friction pad and the substrate, however, a finite amount of slip will appear. As a result, the deformation mechanics of the beam will change in character, and this change in character can be detected by measuring the shape of the top surface of the beam as a function of force on the friction pad and magnitude of oscillating force, being careful as always to model all significant mechanical and electrostatic effects. In principle one can measure both sliding friction and stiction with such a device. As these quantities depend strongly on surface contamination, surface roughness, and the like, their determination is quite useful for quality control purposes.

The device described in FIG. 9, unfortunately, does not function properly in practice. Detailed functional modeling reveals that the friction pad does not remain in solid contact with the substrate, even for large values of friction pad loading and small values of oscillating force. As a result, the measurements are essentially impossible to relate to any fundamental material properties.

Figure 10:
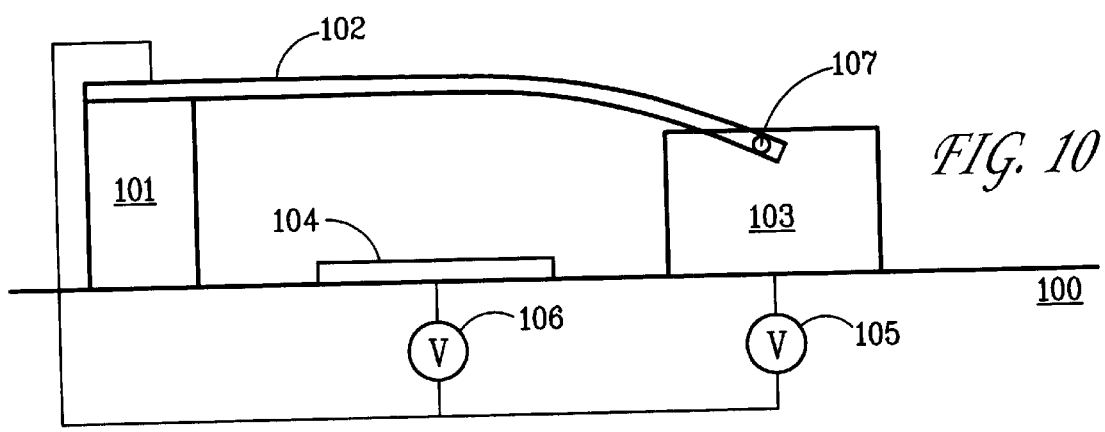
FIG. 10 shows a sliding friction/stiction tester including a friction pad hinge.

A modified sliding friction tester as is shown in FIG. 10 overcomes these problems. The structure is similar to that in FIG. 9, save that the friction pad 103 and the beam 102 are attached not by a solid connection between the two bodies, but through the action of hinge 107. The friction pad 103 is free to rotate about hinge 107, and hence will remain in true sliding contact with substrate 102 if the voltage from voltage source 105 is large enough. Now the measurements of the shape of the top surface of the beam as a function of the magnitude of the two voltages can be analyzed to give the frictional and stictional properties of the surfaces of the friction pad and the substrate.

The second special type of IMaP test structure studies the fracture mechanics of the MEMS structural layers. Fracture limits reflect such material quantities as defect levels, etc., while also being altered by surface roughness and growth irregularities which produce stress concentrators. Fracture threshold can thus be a useful quality control variable, as well as an important design criterion for MEMS design.

Figure 11:
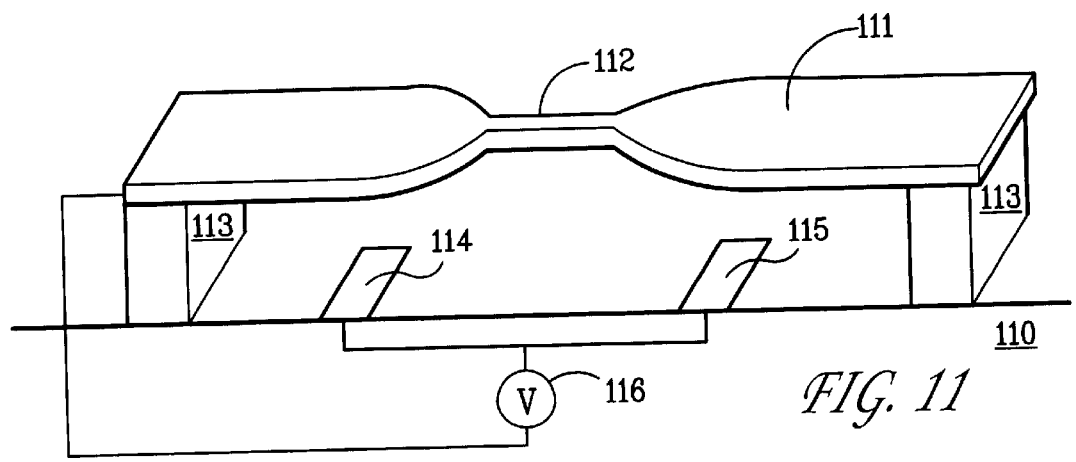
FIG. 11 shows an IMaP fracture tester.

FIG. 11 shows an example of a class of fracture testers suitable for IMaP applications. Beam 111, which is typically much wider than it is thick, and which has notch 112, leaving in this area a small "microbeam", is suspended above substrate 110 by anchors 113. A voltage source 116 supplies a driving voltage to beam 111 and to actuator electrodes 114 and 115. The resulting electrostatic force pulls beam 111 downward, resulting in a very large axial force, which is focused by notch 112 to make the microbeam the most highly stressed part of the tester. When the stress levels in the microbeam are high enough to induce fracture, thereof, the two halves of beam 111 will abruptly drop toward the substrate surface, an event which can be easily detected by measuring the shape of the top surface of beam 111 as a function of the driving voltage. As usual, extraction of actual material parameters requires detailed and complete modeling of the relevant physical phenomena, as discussed earlier. However, a simple criterion that fracture not occur below a given test voltage can prove a useful quality control measure.

Numerous IMaP test structures have been described above, together with how they are operated. The requirements of mechanical and electrostatic modeling required to extract real material and structural parameters from this data have been discussed. The primary element which has yet to be discussed is how the shape of the compliant member (usually of an exposed surface thereof) is to be measured. There are numerous measurement techniques which could be used to measure the shape, e.g., of a bending beam in an IMaP test structure. These include profilometry, interferometric imaging, confocal microscopy, evanescent wave microscopy, capacitive probe microscopy, tunneling probe microscopy, and many others. However, in order to routinely obtain the precision required (2–5 nm) in a rapid and user-friendly manner, the implementations we have carried out have been based on interferometric imaging.

Figure 12:
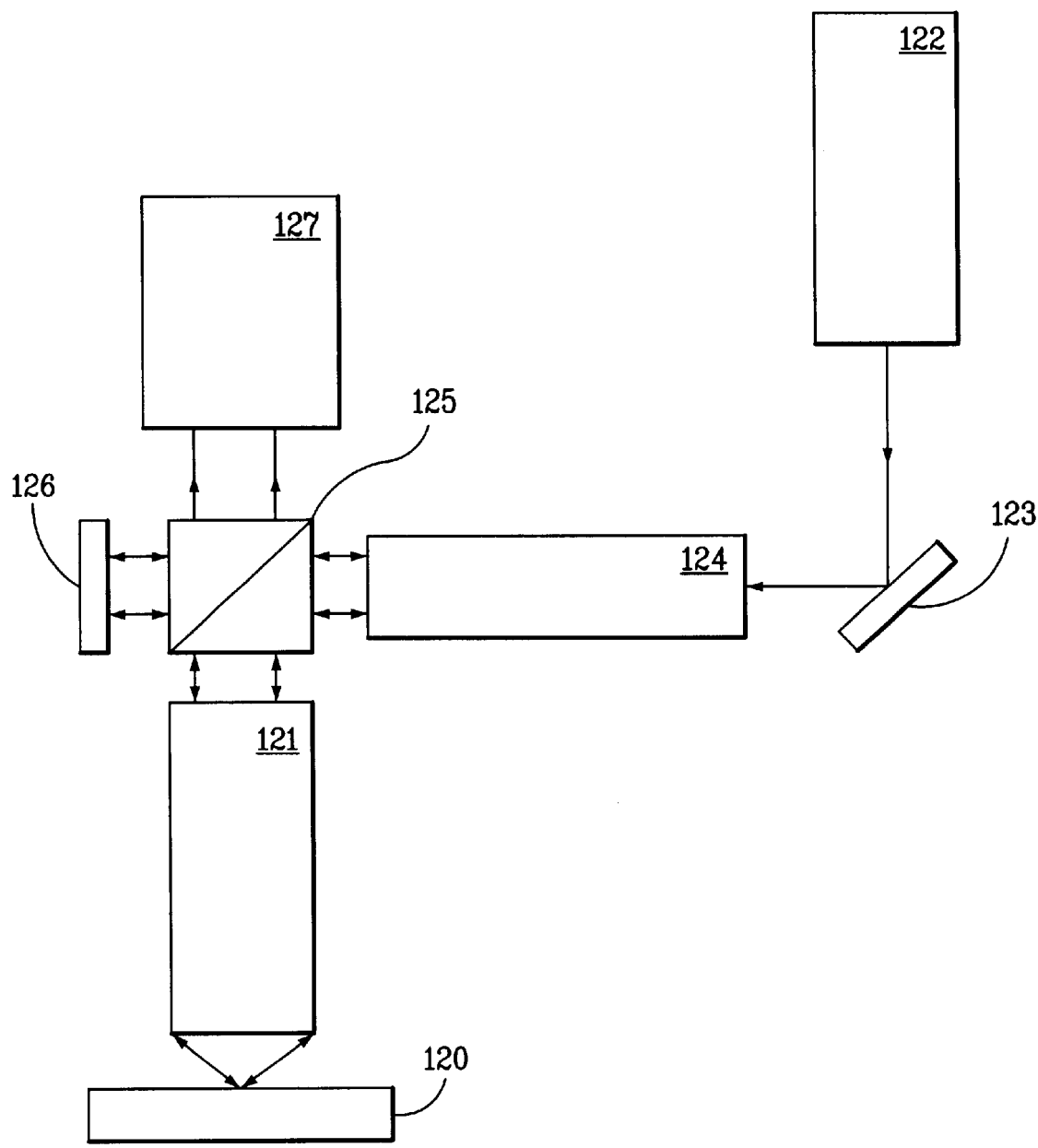
FIG. 12 shows an imaging interferometer suitable for use with IMaP diagnostic methods.

Interferometric imaging is carried out using a microscope-based interferometer operating in the visible. Such an interferometer is shown schematically in FIG. 12. A sample 120 is positioned at the focal point of microscope 121. Monochromatic light is provided by laser 122, and is directed in to beam expander 124 by mirror 123. The expanded laser beam then is split by beam splitter 125 into a pair of beams. One beam goes to reference mirror 126, and then returns to the beam splitter. The other beam passes through the microscope 121, reflects off the substrate surface, and returns to the beam splitter. When the two beams return to the beam splitter, they are combined into a single beam which is directed into camera 127. On being focused within the camera an image of the substrate surface appears. This image is covered by interference fringes which reveal height variations along the surface being imaged.

A computerized fringe counting system is used to analyze the vertical displacement information carried by the fringes. We have succeeded in determining vertical displacement with a precision of as small as 2 nm, corresponding to being able to detect fringe position to about 1% of a single fringe separation. This level of precision allows the routine measurement of displacements due to stress levels as low as 0.1 MPa.

A final requirement for the IMaP apparatus is that means to support and handle the substrate, usually in the form of a thin wafer, without introducing clamping or contact stresses at a level which would negatively impact the IMaP measurements must be used. Applicants have successively used a conventional vacuum chuck, where the vacuum is relieved before measurement are taken. In this case, the contact forces of the voltage probes on the contact areas suffices to hold the substrate from sliding. Alternate approaches would include uses of compliant adhesive materials to limit mounting stresses.

Figure 13:
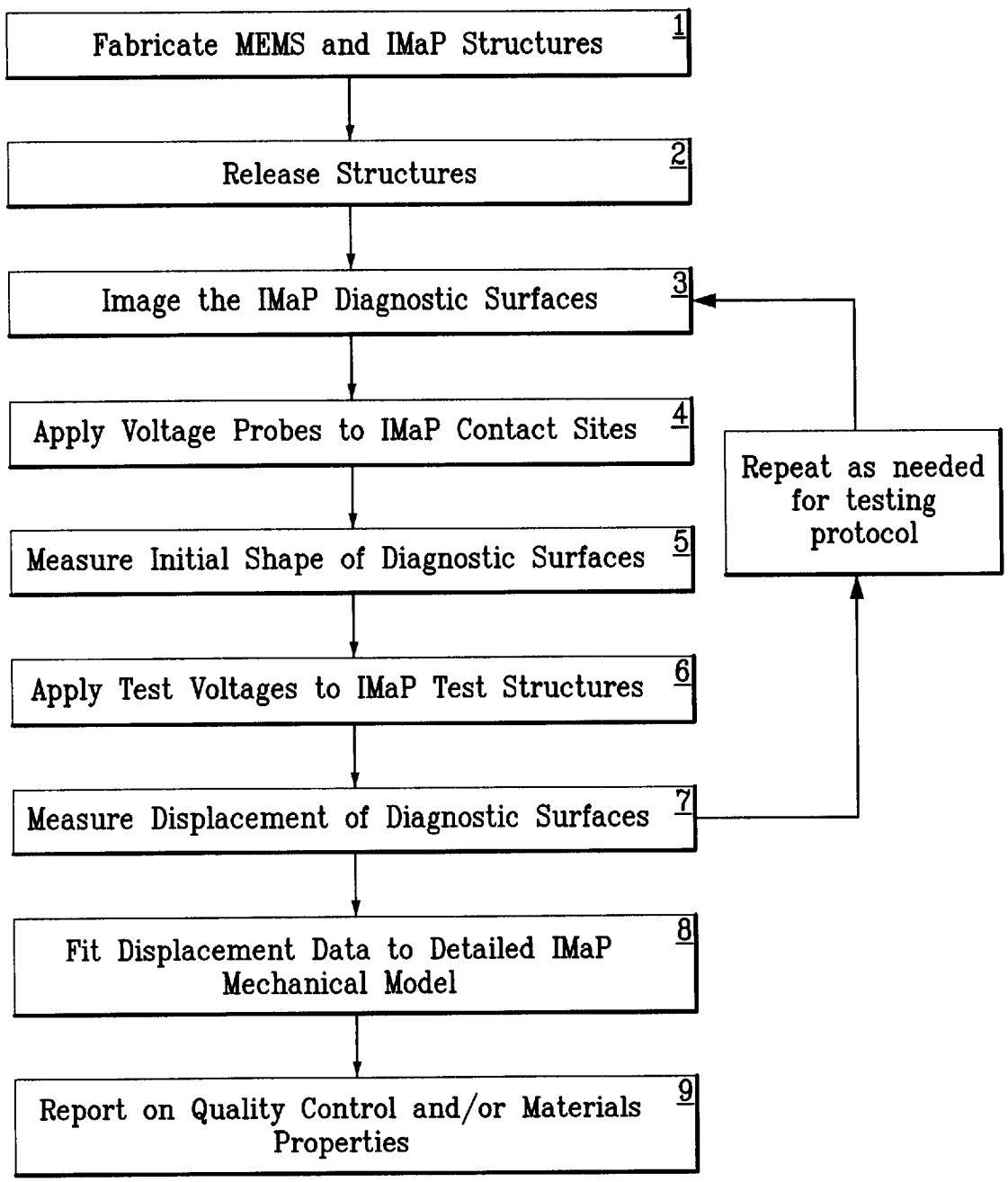
FIG. 13 shows a typical flow diagram for implementation of the IMaP diagnostic method within a MEMS production run.

A coarse diagram of the key steps in carrying out the IMaP processes for quality control and/or material property measurement purposes appears in FIG. 13. Note that this is only one possible sequence of steps—any sequence which will not violate the basic principles of IMaP diagnostics could also be used.

Process step 1 is the cofabrication of the desired MEMS devices and the IMaP test structures. It is important to carry these out via the same processes, so that anomalies in the behavior of the IMaP test structures will reflect something that also affects the MEMS devices.

Process step 2 is the release of the MEMS devices and the IMaP test structures from the sacrificial material which defined their structure and holds their components motionless. There can be a large number of process steps between these two, such as fabrication of microelectronic circuitry on the substrate, but these do not alter the basic IMaP procedures. Process step 2 calls for co-release of the MEMS and IMaP structures. As discussed earlier, this is not required.

Process step 3 calls for the substrate to be positioned so that the diagnostic surfaces of an IMaP test structure are imaged by the imaging interferometer. It is possible to activate and measure multiple IMaP test structures simultaneously, provided they are simultaneously imaged and the required driving voltages can be delivered.

Process step 4 calls for the voltage probes to be placed on the contact sites for the IMaP test structures to be examined. Again, this can be individual or multiple IMaP test structures. Also, alternate means of making contact to the test structures are possible, and can be substituted without leaving the IMaP process.

Process step 5 calls for the interferometric measurement of the initial shapes of the IMaP diagnostic surfaces. The fringe data is digitized and analyzed by a computer to obtain vertical surface information. The various discussions on test structure modeling reveal how important taking this information into proper account is in determining material properties using IMaP.

Process step 6 calls for the test voltages to be applied to the IMaP test structures. There can actually be a series of such voltages to be applied—such repetition will be provided for in a future process step.

Process step 7 calls for measurement of the displacement of the IMaP diagnostic surfaces in response to application of the test voltages in process step 6. There are occasions, such as measurement of surface adhesion, when steps 6 and 7 can best be carried out simultaneously.

Process step 8 allows the setup and measurements of steps 3–7 to be repeated with different conditions and on different IMaP test structures until the entire suite of diagnostic measurements is finished.

Process step 9 calls for fitting the suite of diagnostic data to the detailed IMaP mechanical and electrical response models, so that the key parameters of those models can be determined. The level and sophistication of this analysis will depend on the goal for the diagnostic process. It can be easier to obtain useful quality control information than to obtain accurate material properties.

Finally, process step 10 calls for reporting quality control results and/or materials properties data as obtained based on the IMaP measurements.

As mentioned before, there are many approximately equivalent process paths through which the IMaP diagnostic procedures can be applied to provide quality control and/or material property information. The specific implementation given in FIG. 13 and the above is for purposes of illustration, and is not intended to limit the scope of the instant invention.

What is claimed is:

1. A method for quality control of MEMS fabrication processes, comprising the steps of:

a) fabricating MEMS structures on a substrate;

b) co-fabricating at least one IMaP test structure on said substrate, said at least one IMaP test structure comprising at least one anchor to said substrate, at least one compliant member functionally attached to said anchor, at least one electrostatic actuator so configured as to apply mechanical stress to said at least one compliant member, at least one diagnostic surface whose shape is determined by the response of said at least one compliant member to said mechanical stress, and contact sites whereby each such electrostatic actuator can be actuated by a voltage applied to said contact sites;

c) releasing the at least one IMaP test structure from the substrate;

d) evaluating the substrate by automated process steps comprising:
  α) making effective electrical contact between an external voltage source and said contact sites;
  β) actuating at least one of the at least one IMaP test structures by applying prescribed test voltages to said electrostatic actuators via said contact sites;
  γ) measuring the displacement of the diagnostic surfaces of the actuated IMaP test structures;
  δ) comparing said displacement with corresponding standards for a high-quality fabrication process; and,
  ε) rejecting said substrate if said comparison reveals process flaws outside of pre-established tolerances.

2. The method of claim 1, wherein the MEMS structures fabricated on the substrate are released during said releasing step.

3. The method of claim 1, wherein the step of making effective electrical contact between an external voltage source and said contact sites is carried out by steps including positioning external voltage probes so that they make electrical contact with said contact sites.

4. The method of claim 3, where said external voltage probes take the form of a matrix of external voltage probes relatively positioned in a pattern so that electrical contact can simultaneously be made with the contact sites associated with at least one IMaP test structure.

5. The method of claim 4, where said matrix of external voltage probes can simultaneously make electrical contact with all contact sites for the IMaP test structures fabricated on the substrate.

6. The method of claim 3, wherein said external voltage probes are positioned and brought into electrical contact with said contact sites in a preprogrammed ordering by automated process steps.

7. The method of claim 6, wherein the process of bringing the voltage probes into electrical contact with the contact sites does not introduce unacceptable contact-stress related measurement artifacts.

8. The method of claim 1, such that the prescribed test voltages are concurrently applied to the electrostatic actuators of multiple IMaP test structures.

9. The method of claim 1, such that the prescribed test voltages are sequentially applied to the electrostatic actuators of individual IMaP test structures.

10. The method of claim 1, wherein the step of measuring the displacement of said diagnostic surfaces is carried out by steps comprising taking optical interferometric measurements of said diagnostic surfaces while the corresponding IMaP test structures are actuated.

11. The method of claim 10, wherein said displacement is determined by automated computer analysis of said optical interferometric measurements.

12. The method of claim 1, further comprising the step of measuring the displacement of said diagnostic surface when the corresponding IMaP test structures are not actuated.

13. The method of claim 1, wherein some of said compliant members are chosen from the group consisting of cantilever beams, multiply-anchored suspended beams, fixed-fixed beams, multiply-anchored plates, multiply-anchored multiply-connected plates, and edge-supported diaphragms.

14. The method of claim 1, wherein some of said electrostatic actuators apply said mechanical stress by a mechanism chosen from the group consisting of point-loading, distributed loading, torsional loading, and combinations thereof.

15. The method of claim 1, wherein some of said IMaP test structures are chosen from the group consisting of bending-moment testers, torsion-moment testers, combined-moment testers, surface friction testers, surface stiction testers, tensile fracture testers, flexion fracture testers, torsional fracture testers, and surface adhesion testers.

16. The method of claim 1, further comprising the steps of:
  e) co-fabricating at least one passive IMaP test structure on said substrate, said at least one passive IMaP test structure comprising at least one brace affixed to said substrate, at least one compliant element functionally attached to said brace, and at least one diagnostic surface whose shape is determined by residual stress acting on said compliant element;
  f) releasing the at least one passive IMaP test structure from the substrate;
  g) further evaluating the substrate by automated process steps comprising:
    i) measuring the profile of the diagnostic surfaces of the released passive IMaP test structures; and,
    ii) refusing certification of the processed substrate if the measured profiles vary from ideal values by more than pre-established tolerances.

17. The method of claim 16, wherein some of said at least one compliant element are chosen from the group consisting of cantilever beams, multiply-anchored suspended beams, fixed-fixed beams, multiply-anchored plates, multiply-anchored multiply-connected plates, and edge-supported diaphragms.

18. The method of claim 16, wherein the step of measuring the profile of the diagnostic surface of the released passive IMaP test structures is carried out by steps comprising taking optical interferometric measurements of said diagnostic surfaces.

19. The method of claim 18, wherein the profiles corresponding to said optical interferometric measurements are determined by automated computer analysis of said optical interferometric measurements.

20. The method of claim 1, further comprising the steps of:
  e) further co-fabricating IMaP metrology standards on said substrate;
  f) further evaluating the substrate by automated process steps comprising:
    i) measuring the dimensions of the IMaP metrology standards; and,
    ii) rejecting said substrate if said dimensions fall outside the design values by more than pre-established tolerances.

21. The method of claim 20, wherein said IMaP metrology standards comprise at least one pit etched from the surface down to a depth characteristic of a buried structural interface.

22. The method of claim 20, wherein said IMaP metrology standards comprise at least one lateral dimensional standard.

23. The method of claim 20, wherein measuring the dimensions of the IMaP metrology standards is carried out using a profilometer.

24. The method of claim 21, wherein measuring said depth comprises use of a capacitive probe.

25. The method of claim 22, wherein measuring the dimensions of said lateral dimensional standard is carried out through microscopic image analysis.

26. The method of claim 1, further comprising determining mechanical properties of the material making up the IMaP test structures through analysis of the displacement of the diagnostic surfaces and detailed modeling of the IMaP test structure geometries.

27. A MEMS fabrication quality control apparatus, comprising:
   a) a mount capable of holding at least one process wafer without inducing unacceptably large values of mounting stress in the at least one process wafer, all of said at least one process wafer having at least one IMaP test structure fabricated thereon, said at least one IMaP test structure comprising at least one anchor to said process wafer, at least one compliant member functionally attached to said anchor, at least one electrostatic actuator so configured as to apply mechanical stress to said at least one compliant member, at least one diagnostic surface whose shape is determined by the response of said at least one compliant member to said mechanical stress, and contact sites whereby each such electrostatic actuator can be actuated by a voltage applied to said contact sites;
   b) voltage probes capable of making electrical contact to said contact sites;
   c) a voltage source functionally connected to said voltage probes, and which applies voltages as controlled by voltage control data;
   d) an imaging optical interferometer comprising a camera which captures an optical interferometric image, converts said image into image data suitable for automated computer analysis, and transmits said image data to an apparatus controller;
   e) a positioner which adjusts the relative position and orientation of the voltage probes, the imaging optical interferometer, and the mount in response to position control data;
   f) said apparatus controller, comprising:
      1) a control computer comprising a central processing unit, a voltage control data source, a position control data source, an image data input receptor, and reporting means to report the results of the quality control analysis;
      2) control software which directs the MEMS fabrication quality control apparatus to carry out steps including:
         a) positioning the voltage probes, the imaging optical interferometer, and the mount so that the optical interferometric image provided by the imaging optical interferometer includes the image of an IMaP test structure, including its diagnostic surfaces, and also so that the voltage probes make electrical contact with the contact sites connected to said imaged IMaP test structure;
         b) generating voltage control data so that voltages programmed to activate the imaged IMaP test structure are applied to the voltage probes;
         c) commanding the control computer to accept image data from said camera;
         d) analyzing said image data to determine the shape of the diagnostic surfaces of the imaged IMaP test structure; and,
         e) evaluating the level of process quality by analyzing the diagnostic surface shapes for the imaged IMaP test structure.

28. The apparatus of claim 27, wherein said mount grips the at least one process wafer by inducing a vacuum between the mount and the process wafer.

29. The apparatus of claim 28, wherein said vacuum is relieved during the process of imaging the imaged IMaP test structure.

30. The apparatus of claim 29, wherein the pressure applied by the voltage probes on the contact sites prevents the process wafer from shifting during the process of imaging.

31. The apparatus of claim 27, wherein said mount grips the at least one process wafer by introducing a compliant adhesive between the mount and the process wafer.

32. The apparatus of claim 27, wherein said voltage probes are combined into at least one matrix of voltage probes, the voltage probes in each such matrix being relatively positioned in the pattern of the contact sites of an IMaP test structure.

33. The apparatus of claim 32, wherein at least one matrix of voltage probes are so relatively positioned that simultaneous electrical contact can be made with multiple IMaP test structures.

34. The apparatus of claim 27, wherein said voltage source is capable of supplying each voltage probe with an individually controllable voltage.

35. The apparatus of claim 27, wherein said control software further directs the MEMS fabrication quality control apparatus to carry out process steps 26(f)(2)(a–d) on multiple IMaP test structures, the resulting shape information being combined and used in the process step 26(f)(2)(e) evaluation of the level of process control.

36. The apparatus of claim 27, wherein said control software also computes a set of material properties derived from the shape of the diagnostic surfaces.

* * * * *